US006768297B2

United States Patent
Johnson et al.

(10) Patent No.: US 6,768,297 B2
(45) Date of Patent: Jul. 27, 2004

(54) HIGH SPEED VLSI DIGITAL TESTER ARCHITECTURE FOR REAL-TIME OUTPUT TIMING ACQUISITION, RESULTS ACCUMULATION, AND ANALYSIS

(75) Inventors: John C. Johnson, Phoenix, AZ (US); Christopher J. Nelson, Gilbert, AZ (US); Donald E. Edenfeld, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 590 days.

(21) Appl. No.: 09/725,401

(22) Filed: Nov. 29, 2000

(65) Prior Publication Data

US 2002/0063556 A1 May 30, 2002

(51) Int. Cl.[7] .............................................. G01R 31/28

(52) U.S. Cl. ..................... 324/158.1; 324/73.1; 714/726

(58) Field of Search ............................. 324/158.1, 73.1; 714/726

(56) References Cited

U.S. PATENT DOCUMENTS

| 4,577,318 A | * | 3/1986 | Whitacre et al. ........... 714/700 |
| 4,806,852 A | * | 2/1989 | Swan et al. ................. 324/73.1 |
| 5,212,443 A | * | 5/1993 | West et al. ................. 324/73.1 |
| 5,461,310 A | * | 10/1995 | Cheung et al. ........... 324/158.1 |
| 5,477,139 A | * | 12/1995 | West et al. .............. 324/158.1 |
| 6,114,870 A | * | 9/2000 | Vogley ..................... 324/158.1 |

* cited by examiner

Primary Examiner—N. Le
Assistant Examiner—Timothy J. Dole
(74) Attorney, Agent, or Firm—Schwegman, Lundberg, Woessner & Kluth, P.A.

(57) ABSTRACT

A tester for testing a digital device. The tester includes a plurality of time measurement units to measure transition timing values of output data of each output pin of the digital device in each test cycle. A plurality of result operations units performs real-time arithmetic operations on the measured transition timing values to produce a pass/fail result and additional test results. A plurality of result accumulators stores the pass/fail result and a number of selected test results. And a capture/analysis engine captures and analyzes the pass/fail result and the selected results to provide comprehensive test performance of the digital device.

31 Claims, 4 Drawing Sheets

HIGH SPEED VLSI DIGITAL TESTER ARCHITECTURE FOR REAL-TIME OUTPUT TIMING ACQUISITION, RESULTS ACCUMULATION, AND ANALYSIS

TECHNICAL FIELD OF THE INVENTION

The present invention relates generally to digital testers, and in particular to automatic test equipment (ATE) used for testing very large system integration (VLSI) digital devices.

BACKGROUND OF THE INVENTION

VLSI devices such as microprocessors and memory devices are commonly used in computers and electronic products. To ensure that these devices perform properly, a test is applied to them at various points during manufacturing process to measure their performance.

To test a VLSI device, ATE (or tester) is commonly used. Traditional ATE performs the test using a typical test method commonly referred "go/no-go" method. Traditional ATE has several main units for performing the test. A compare unit compares output data of the device under test (DUT) with expected data provided by a pattern data memory. After the compare unit compares the output data, a data timing strobe unit such as a D-Q latch strobes the output data at a fixed time to obtain a single pass/fail result for each location of the pattern memory. A capture unit receives the pass/fail result to indicate if the device has either passed or failed the test. Thus, in traditional ATE, the information available after a pattern test executes is either "all pattern locations pass" or "at least one pattern location fails". As VLSI devices progressively operate with higher speed, new techniques are needed to ensure that a device's output signals propagate to other devices with correct timing relationships for the application environment. For example, one common technique is to allow the device sending a data signal to also send a timing reference signal (known as a clock or strobe) used to locate the point in time that a data signal (or group of such data signals) has the correct one or zero data state. Testing output pin performance of these so-called source referenced devices is extremely difficult with traditional ATE. Traditional ATE use an internally generated timing reference and use a pre-determined delta from that time to look for valid data on a device output pin. The problem is that the valid data timing reference needs to come from the device strobe, it varies from one test pattern location to the next, and it cannot be accurately pre-determined.

To use traditional ATE on source referenced devices, the test patterns are iterated many times while the time values are incremented to find pass/fail boundaries. The timing of the pass/fail boundary is compared between the output data signal and the output strobe signal to determine if the required timing relationship is correct. This iterative pattern execution is very time consuming. In addition, it does not accurately determine the timing relationship for each strobe/data instance. Instead, it lumps all of the results together and can either pass marginally bad results or fail marginally good results. Variability of device timings can result in a good device in the application environment failing a test in the ATE environment.

For the reasons stated above, and for other reasons stated below which will become apparent to those skilled in the art upon reading and understanding the present specification, there is a need in the art for improved ATE.

DETAILED DESCRIPTION OF THE INVENTION

The following detailed description refers to the accompanying drawings which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
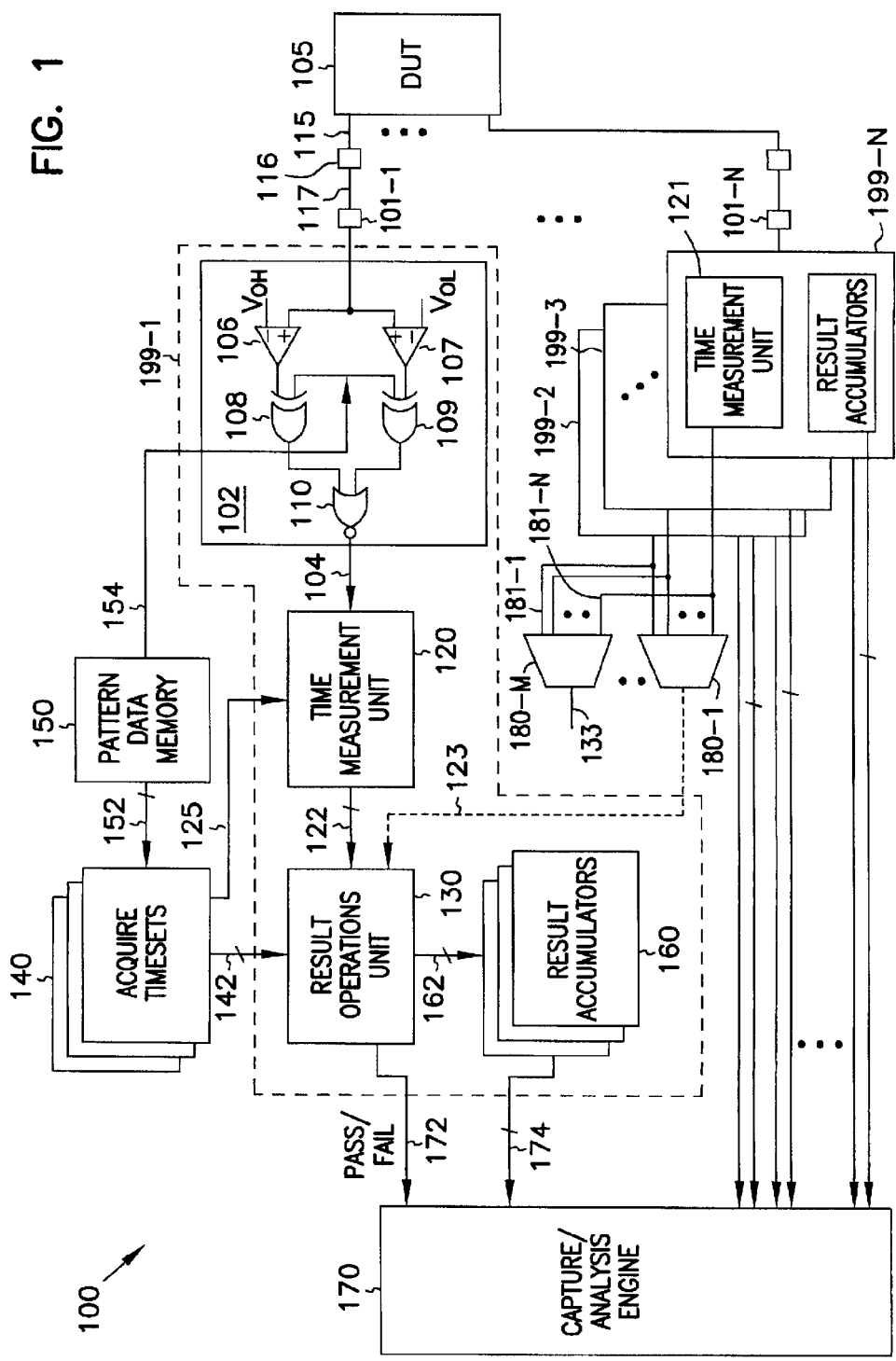
FIG. 1 is a block diagram illustrating a digital tester according to the invention.

FIG. 1 is a block diagram illustrating a digital tester 100 according to the invention. Tester 100 includes a pattern data memory 150 connected to a plurality of acquire timesets 140 via lines 152. Tester 100 also includes a plurality of channel circuits 199 1-N. Acquire timesets 140 connects to channel circuit 199-1 via lines 142 and line 125. Pattern data memory connects to channel circuit 199-1 through line 154. For simplicity, FIG. 1 only shows acquire timesets 140 and pattern data memory 150 connected to channel circuit 199-1. However, acquire timesets 140 and pattern data memory 150 also connect to other channel circuits 199 2-N in the same way. Thus, channel circuits 199 2-N also have connection lines such as lines 142, 125 and 154 but are not shown. Tester 100 also includes a capture/analysis engine 170. Each of the channel circuits 199 1-N connects to capture/analysis 170 via line 172 and lines 174. For simplicity, only line 172 and lines 174 connected between channel circuit 199-1 and capture/analysis 170 are labeled.

All channel circuits 199 1-N are constructed the same. For simplicity, only channel circuit 199-1 is shown in detail in FIG. 1. Channel circuit 199-1 includes a channel input 101-1. Channel input 101-1 connects to a compare circuit 102. A time measurement unit 120 connects to compare circuit 102 via line 104. A result operations unit 130 couples to time measurement unit 120 via lines 122. A plurality of result accumulators 160 connects to result operations unit 130 through lines 162. Other channel circuits 199 2-N also have the same units such as units 102, 120, 130, and 160, however, they are not shown for simplicity. Each of the other channel circuits 199 2-N also has a channel input such as channel input 101-1 of channel circuit 199-1. For example, channel circuit 199-N has a channel input 101-N. In addition, for clarity, the time measurement unit of channel circuit 199-N is given a reference number 121 to distinguish it from the time measurement unit 120 of channel circuit 199-1.

Tester 100 also has a plurality of channel selectors 180 1-M. Each of the channel selectors 180 1-M has a plurality of inputs 181 1-N and an output. Each of the inputs 181 1-N connects to time measurement unit 120 of each of channel circuit 199 1-N. For simplicity, only some of the connections between channel selector 180 1-N and time measurement units 120 are shown. The output of channel selector 180-1 connects to line 123, which connects to result operations unit 130 of channel circuit 199-1. The output of channel selector 180-M connects to line 133. Line 133 connects to a result operations unit 130 of one of the channel circuit 199 2-N. In this arrangement, a result operations unit 130 of one channel circuit can connect to two time measurement units; it connects to a time measurement unit within its own channel circuit via line 122 and to another time measurement circuit of another channel circuit via a line such as line 123 or 133.

Since each of the channel circuits 199 1-N of tester 100 has a channel input, tester 100 has a plurality of channel inputs 101 1-N. Channel inputs 101 1-N are used to receive input signals from a device under test (DUT) 105. DUT 105 has a plurality of pins 115. Each of the pins 115 connects to one of the channel inputs 101 1-N via a connector 116 and line 117.

Throughout the text of the application, terms such as data, output data, output signal, data signal and output data signal describe the same subject, which is a signal provided by an output pin of DUT 105. An output pin refers to any pin 115 that provides an output signal during a test. Furthermore, terms such as tester and ATE are used interchangeably; both terms refer to testing machine.

Tester 100 of FIG. 1 can test both common and non-common clock-timing devices. To test a common clock-timing device, tester 100 generates a clock to strobe output data of the device. To test a non-common clock-timing device (or source-referenced clock-timing device), the tester 100 uses a reference clock signal generated by the device to strobe the output data. The source-referenced clock-timing devices include, but are not limited to, devices that use source-synchronous, clock-embedded-in-data outputs and simultaneous bi-directional timing strategies. In testing the source-referenced clock-timing devices, a timing value of the clock signal is used as a reference timing value for comparison with a timing value of a data signal. In some cases, the device has more than one source-referenced clock signals. Each of these clock signals corresponds to a group of data signals. In such cases, the timing value of the clock signal in a particular group is used as reference timing value for comparison to timing values of the data signals within that same particular group.

Pattern data memory 150 can be a typical pattern data memory, which can be found in many traditional common clock-timing testers. It can consist of multiple register fields that are addressable to the required pattern depth (8 Meg to 128 Meg vectors of pattern addresses is typical). The register fields can typically represent each tester pin's stimulus and expect data ('1' or '0' value) and input/output direction. Additional fields are used to select predefined timing and format acquire timesets 140 in a fashion similar to 'Timeset' selection performed by traditional testers. The pattern memory register fields can also be constructed from discrete or embedded dynamic random access memory (DRAM) components that are either centrally located or distributed throughout the tester architecture.

Time measurement unit 120 can be any discrete or integrated circuit that provides a digital representation of the time between a digital transition start and stop event. The stop event can also be conditional to ignore those events that do not meet predefined criteria such as direction of the transition or the expected time of the transition. Time measurement unit 120 can be replicated to allow the continuous measurement of transitions that occur at a frequency faster than an individual time measurement unit 120 can complete a measurement. Any start/stop timing technique can be used to implement the measurement function. One well-known way is to use constant current charging of a capacitor during the timing duration with the resulting voltage across the capacitor representing the time measured. The voltage is then digitized using an analog to digital converter. The specific implementation can use information from acquire timesets 140 to narrow the search window and improve the time to measure for a given measurement resolution.

Acquire timesets 140 is a plurality of registers that store setup information of time measurement unit 120. Acquire timesets 140 also store the arithmetic operation(s) to be executed by result operations unit 130, and the pass/fail timing limits for result operations unit 130. Other information to support measurement and test of a device output can also be stored in acquire timesets 140. To allow for different types of device output response measurements, multiple acquire timesets 140 can be implemented per tester pin and can be chosen during pattern execution by the pattern data memory 150.

Result operation unit 130 can be a plurality of arithmetic logic units (ALU's) capable of performing math functions on 2 digital operand values. Math (arithmetic) functions such as add, subtract, min/max limit test, and others can be implemented. The output of result operation unit 130 can also be pass/fail and a digital math operation result. Result operation unit 130 can be replicated to allow continuous math operations that occur at a frequency faster than an individual result operation unit 130 can complete a measurement. Those of ordinary skill in the art will readily recognize that ALU's of this type are used in digital signal processing applications, and multiple high-speed ALU's are common in integrated neural network circuits.

Result Accumulators 160 are used to collect and process information from result operation unit 130. Each of the result accumulators 160 is associated with one acquire timeset 140. In this way, tester 100 can assess device response performance while storing a smaller set of device response information to minimize data storage space required. Result accumulators 160 can be a plurality of registers and arithmetic logic units capable of holding or storing data and performing math accumulation operations. Results accumulators 160 can also capture certain fixed information such as absolute minimum and maximum value and relative minimum and maximum value. Furthermore, results accumulators 160 can also be programmed to capture other information such as average value, sampled values, etc. In addition, statistical result accumulation can be implemented to allow more complex signal analysis. Result accumulator 160 can be replicated to allow continuous math operations that occur at a frequency faster than an individual result accumulator can operate. This type of analysis process occurs in the digital signal processing section found in many traditional digital oscilloscopes.

Capture/analysis engine 170 can be implemented in software or hardware or both. It can be used to review the overall pass/fail condition of the device responses and process the value stored in results accumulators 160. The implementation can be optimized between hardware and software to achieve desired speed, flexibility, and cost of the analysis function. Information such as a device output pin's timing jitter could be found by running an analysis on the accumulated results after the device test pattern execution has completed. Further, the function of capture/analysis engine 170 can be implemented centrally and shared between tester pins or replicated for faster parallel operations on a per-pin basis. This type of accumulate and analyze process occurs in many traditional digital oscilloscopes.

Referring to tester 100 of FIG. 1, during a test, DUT 105 produces output data on pin 115. Compare circuit 102 receives an output data at channel input 101-1 and compares the output data with predetermined voltage levels and expected data. Pattern data memory 150 provides expected data to compare circuit 102 via line 154. Compare circuit 102 provides the result of the comparison on line 104 in the form of a signal, which represents the original output data produced by pin 115. Time measurement unit 120, based on a reference time, measures the signal on line 104 to determine a time value when the signal makes a transition. That is, the time when the signal on line 104 changes its signal level, e.g., from a low to a high signal level. The measured transition time of signal on line 104 is referred to as transition timing value of the output data. The measurement of the transition timing value is then provided on line 122. Since tester 100 includes multiple time measurement units 120 associated with individual DUT output data, a set of measured transition timing values are obtained by the time measurement units 120 during each test cycle.

Result operations unit 130 receives the timing value on line 122 and performs arithmetic operations on the timing value to produce test results. The type of arithmetic operations performed by result operations unit 130 depends on which of the timesets is currently used by acquire timesets 140. The type of arithmetic operations can be one or a combination of addition, subtraction, multiplication and division operation. Pattern data memory 150 selects which timeset is to be used for a particular test by giving selection commands to acquire timesets 140 via lines 152.

After the arithmetic operations are performed, the test results are provided on lines 162 and 172. Line 172 provides only the pass/fail result. Lines 162 provide both the pass/fail result and other test results. Result accumulators 160 store the pass/fail result and selected number of the other test results provided on lines 162. Capture/analysis engine 170 receives the pass/fail result on line 172. Capture/analysis engine 170 also receives the other stored results provided on line 174 from result accumulators 160.

At the beginning of the test, compare circuit 102 receives an output data on channel input 101-1; the output data is provided by output pin 115 of DUT 105. DUT 105 can be an integrated circuit, a memory device, a microprocessor, or other VLSI devices. Compare circuit 102 performs voltage and logic level comparisons to the output data received from output pin 115. In the voltage level comparison, the output data is compared against the predetermined voltage levels. When the output pin voltage level exceeds a $V_{OH}$ reference, the output pin state is a logic level one. When the output pin voltage level falls below a $V_{OL}$ reference, the output pin state is considered a logic level zero. When the output pin voltage level is below the $V_{OH}$ reference and above the $V_{OL}$ reference, the output pin state is considered a mid level. The $V_{OH}/V_{OL}$ voltage reference levels can be expressed as a percentage of the device supply voltage. In addition, they can both be the same value (commonly set to 50% of the device supply voltage in this case). Comparators 106 and 107 determine if the voltage level (either low, high, or mid) of the output data meets or satisfies the voltage level of $V_{OH}$ or $V_{OL}$. In the logic level comparison, a logic level of the output data is compared against a logic level of an expected data provided by pattern data memory 150 on line 154. Expected data can vary with the specific ATE design. Typical expect capabilities include the ability to detect a logic one, a logic zero, an intermediate logic state, an unknown state, or a valid state (logic level is a one or zero). To simplify the description, logic level one and zero detection will be assumed but it is apparent to those skilled in the art upon reading and understanding the present specification, that other comparison modes can be supported by the invention. Logic level comparison is performed by Exclusive OR gates 108 and 109. After gates 108 and 109 compare the logic levels of the output data and the expected data, compare circuit 102 combines the $V_{OH}/V_{OL}$ pattern compare results via NOR gate 110 on line 104. This output indicates if the DUT is currently matching the pattern expect data (1=match, 0=no match).

In "go/no-go" fixed timing testing of traditional ATE, the signal on line 104 is strobed at a single fixed, pre-determined timing window to determine if DUT 105 has passed or failed the test based on the information provided by the output data on line 104. The traditional ATE, however, only provides a pass/fail result without any additional results of useful information in relation to the pass/fail result. Thus, other performance characteristics of DUT 105, either pass or failure, cannot be efficiently determined or analyzed.

With the novel architecture of tester 100, not only the pass/fail result is acquired, but additional test results or test values are also acquired. The additional test values are selectively stored in result accumulators 160 for further analysis of the pass/fail result. The analysis is performed to determine the overall performance of the DUT during the test. The additional test values include, but are not limited to, absolute timing values, relative timing values, and other relevant timing values calculated according to acquire timesets 140.

Each one of the acquire timesets 140 has a number of sets of pre-determined test timing limits and other test parameters. The sets of test timing limits include, but are not limited to, a set of minimum and maximum absolute timing limits, a set of minimum and maximum relative timing limits, and other relevant test parameter and limits.

After compare circuit 102 provides the output data on line 104, time measurement unit 120 measures a transition of the output data to obtain a measured timing value. This measured timing value is referred to as absolute timing value. The absolute timing value of each output data is used to calculate not only the pass/fail result but also other test results. The absolute timing value is a timing value measured by time measurement unit 120 at a time when the output data makes a transition in relation to a reference time known to tester 100.

Figure 2:
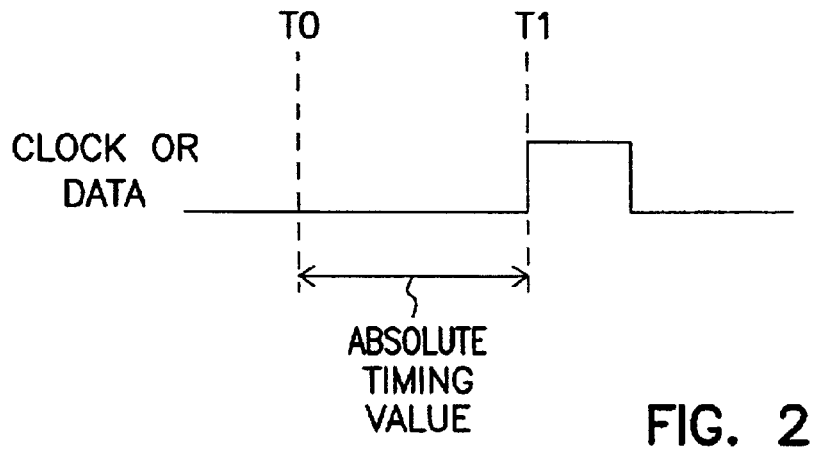
FIG. 2 illustrates an exemplary measurement of an absolute timing value.

FIG. 2 illustrates an exemplary measurement of an absolute timing value of output pin 115 of DUT 105 during a test cycle. In the Figure, T0 is assumed to be a reference time of tester 100. Therefore, a time that occurs after T0 can be measured by subtracting T0 from that time. In other words, the absolute timing value is a lapsed time between T0 and the time when a transition of the output data occurs. For example, in FIG. 2, at time T1, a transition (low to high) of the output signal occurs. The output signal can either be the signal of a clock or a data signal. If T1 is 4.2 ns after time T0 (T1=T0+4.2 ns), then the absolute timing value is 4.2 ns (T1 minus T0). If T1 is 4.5 ns after time T0 (T1=T0+4.5 ns), then the absolute timing value is 4.5 ns.

Time measurement unit 120 measures transition timing values of output signals based on commands given from acquire timesets 140 on lines 125. Acquire timesets 140 can determine which test cycle a transition of the output data exists. Therefore, for any given test cycle, time measurement unit 120 can expect the arrival of the transition of the output data. In some cases, however, the output data has no transition between two consecutive periods of within a test cycle. For example, the output data is at the same level (either high level or low level) for two consecutive periods. In such cases, time measure unit 120 ignores the measurement of transition timing values between those two consecutive cycles. In summary, timing measurement unit 120 measures transition timing value of output signal of an output pin when the output pin is designated to have an output signal in each test cycle. The measured timing value is provided on line 122.

Result operation unit 130 performs arithmetic operations on the measured timing value provided on line 122 to provide the pass/fail result and other test results. The measured timing value is provided by time measurement unit 120. In some cases, result operation unit 130 also performs arithmetic operations on the timing values provided by different time measurement units. In these cases, one measured timing value is used as reference timing value for calculating a relative timing relationship between two output data provided by two output pins. For example, to test a device using a source-referenced clock timing, a timing value of the clock signal generated by the device is needed as a reference timing value. The reference timing value and a timing value of a data signal are used to calculate timing requirements such as setup and hold times. Setup and hold times are well known to those of ordinary skill in the art.

In FIG. 1, if time measurement unit 120 of channel circuit 199-1 provides a timing value of the data signal on line 122, then a reference timing value of a clock signal provided by another time measurement unit is needed to calculate the setup and hold times. For example, if channel input 101-N of channel circuit 199-N is designated to receive a clock signal from DUT 105, then the timing value of the clock signal is used as a reference timing value. In this case, channel selector 180-1 selects the timing value measured by time measurement unit of channel circuit 199-N and provides it on line 123. Thus, in this example, result operation unit 130 of channel 199-1 performs arithmetic operations on the timing values provided by two time measurement units, one from its own channel circuit and the other one from channel circuit 199-N. Line 123 is shown in dashed line to indicate that a timing value from one time measurement unit is not always needed as a reference timing value by another result operation unit. The reference timing value is only needed to calculate a relative timing relationship between two output signals of two output pins.

Figure 3:
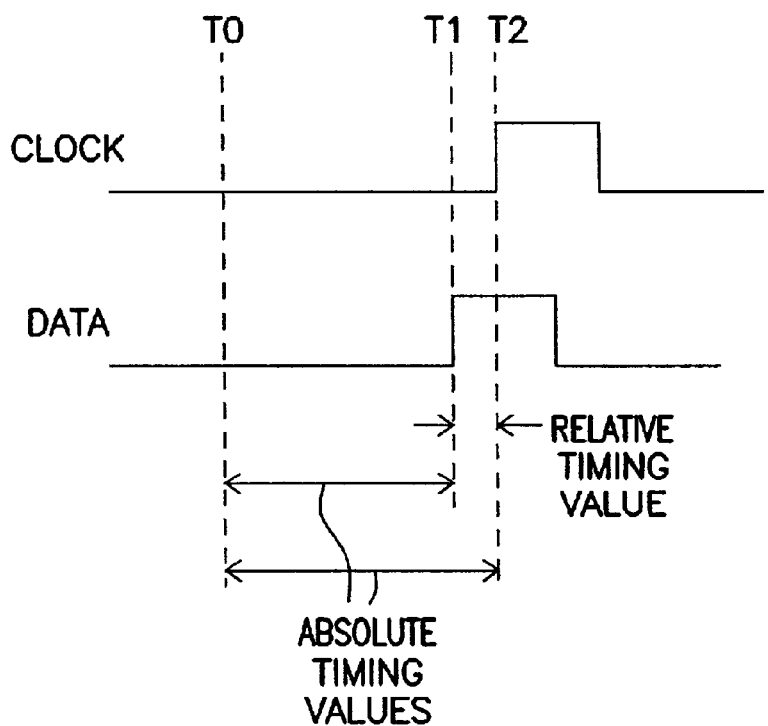
FIG. 3 illustrates an exemplary calculation of a relative timing value.

FIG. 3 illustrates an exemplary calculation of a relative timing value between two output pins 115 of DUT 105 of FIG. 1. In the Figure, T0 is assumed to be a reference time of tester 100. The clock signal represents the signal of one output pin 115. The data signal represents a data signal of another pin 115. At time T1, the data signal makes a transition, and at time T2, the clock signal makes a transition. If time T1 is 4.0 ns after time T0 and time T2 is 4.8 ns after time T0, then the absolute timing value of the data signal is 4.0 ns, and the absolute time value of the clock signal is 4.8 ns. In this example, the absolute timing values are measured by two different time measurement units, such as units 120 and 121 of FIG. 1. In this case, the relative timing value is −0.8 ns (4.0 ns−4.8 ns), which is the difference between the absolute timing values of the data and clock signals. In general, a relative timing value is the difference between two absolute timing values.

Since each pin 115 of DUT 105 connects to one channel input 101-1, and each of the channel inputs 101 1-N of tester 100 connects to one time measurement unit 120. A transition of an output data of each output pin of DUT 105 can be measured in each test cycle to produce an absolute timing value. Each absolute timing value is applied, in real-time, to one or more result operation unit 130. Result operation unit 130 performs, in real-time, arithmetic operations on the absolute timing value provided from one or more time measurement unit 120 to produce a pass/fail result and other test value results. "Real-time" arithmetic operations mean operations performed by result operation unit 130 occur as soon as the absolute timing values are applied to result operation unit 130 from time measurement unit 120.

Result operation unit 130 performs arithmetic operations based on specific test requirements set by timesets 130 to provide a pass/fail result. In one arithmetic operation, the pass/fail result is determined by comparing the absolute timing value with absolute timing limits. In another arithmetic operation, the pass/fail result is also determined by comparing the relative timing value with relative timing limits. Result operation unit 130 also provides other relevant timing values or test results based on the type of timeset selected by acquire timesets 140. After the arithmetic operations are performed, result operation unit 130 provides a pass/fail results on line 172 to capture/analysis engine 170. The pass/result and other timing values are also provided on lines 162 to result accumulators 160.

Results accumulators 160 store the pass/fail result and other timing values for further analysis of the pass/fail result. Since each of the acquire timesets 140 have different sets of test requirements, different set of timing values and other values are selectively stored for each test by result accumulators 160.

Result accumulators 160 store the pass/fail result and selected timing values. The selected timing values include different sets of timing values. The sets of timing value stored by result accumulators 160 include a set of absolute timing value and a set of relative timing value. A set absolute timing value, in some cases includes a set of reference timing. Each set of stored timing value includes extreme timing values. The extreme timing values are the smallest and the biggest absolute timing value or relative timing values of the measured timing values in the test. Since millions of test vectors are applied to the DUT during the test, the number of measured timing values is also in the millions. However, the number of selected absolute or relative timing values will only be in the tens or hundreds. Thus, the number of selected absolute timing values and the number of selected relative timing values are substantially smaller than the number of measured timing values.

The following example illustrates how a pass/fail result and additional timing values are obtained by result operation unit 130 and are selectively stored by result operations unit 130. It is assumed that the minimum absolute timing limit is set at 4.5 ns and the absolute maximum timing limit is set at 5.5 ns. These absolute timing limits are set or predetermined by acquire timesets 140. A transition of the output data occurring within these absolute timing limits is considered as a pass. A transition occurring outside these absolute timing limits is considered as a failure. During the test, the transition of the clock signal may occur at different times for different test cycles. For example, the transition may occur at 4.6 ns, 4.7 ns, 5.1 ns, and 5.4 ns. These are the absolute timing values measured by time measurement unit 120. Only four absolute timing values are demonstrated for simplicity, however, there are millions of absolute timing values measured by time measurement unit 120 in each test, because there are millions of test vectors applied in each test. In the example, since all transitions of the clock signal occur within the absolute timing limits (within 4.5 ns and 5.5 ns), result operation unit 130 will indicate a pass result on line 172. However, if the transitions of the clock signal occur at 3.8 ns, 4.7 ns, 5.1 ns, and 5.9 ns, then result operations unit 130 will indicate a fail on line 172, because at least one of the transitions occurs outside the absolute timing limits. In this case, 3.8 ns and 5.9 ns are outside timing limits 4.5 ns and 5.5 ns.

From the example immediately above, if the output data represents a clock signal, then not only the pass/fail result is provided by result operations unit 130, but other timing values can also be selectively stored by result accumulators 160 for further analysis of the pass/fail result of the clock. Result accumulators 160 can select timing values 4.6 ns and 5.4 ns and store these as extreme values along with the pass result. Result accumulators 160 can also select extreme timing values 3.8 and 5.9 and store these values with the fail result. These extreme values can be categorized or defined for future reference during the analysis of the result. For example, timing value 4.6 ns is a pass minimum absolute timing value, which is a smallest absolute timing value appearing within the absolute timing limits and recorded along with the pass result. Timing value 5.4 is a pass maximum absolute timing value, which is which is a biggest absolute timing value appearing within the absolute timing limits recorded along with the pass result. Similarly, a fail minimum absolute timing value, which is a smallest absolute timing value appeared outside the absolute timing limits and recorded along with the fail result. Timing value 5.9 is a fail maximum absolute timing value, which is the biggest absolute timing value appeared outside the absolute timing limits and recorded along with the fail result. In general, results accumulators store the extreme absolute timing values. The extreme values are the pass/fail minimum and maximum transition timing values of the output data in all test cycles.

Result accumulators 160 also store other timing values such as a set of relative timing values calculated by result operation unit 130. The set of relative timing value stored includes extreme relative timing value. As defined previously, relative timing value is the difference between two absolute timing values. The following example shows how extreme relative timing values are stored. It is assumed that absolute timing value measured by a time measurement unit 120 is the absolute timing value of data signal. It is also assumed that, in each test cycle, the data signal transitions are measured at 4.0 ns, 4.2 ns, and 4.7 ns. Typically, the data signal must be within the setup and hold times of a clock signal for it to pass a test cycle. Therefore, both absolute timing values of the data and the clock signals are needed by result operation unit 130 to determine the pass/fail result of the data signal.

Since the absolute timing value of the data signal is provided by time measurement unit 120, the absolute timing value of the clock signal from another time measurement unit also needed. In this case, time measurement unit 121 provides the absolute timing value of the clock signal to result operation unit 130. For purposes of example, it is assumed that the absolute timing value of the clock signal measured by time measurement unit 121 is 4.8 ns in all test cycles, and the minimum and maximum relative timing limits set by acquire timesets 140 are −2.0 ns and 0 ns, respectively. The relative timing values in this case are the differences between the absolute timing value of the clock signal and each of the absolute timing value of the data signals. Thus, the relative timing values are −0.8 ns, −0.6 ns, and −0.1 ns (4.0 ns–4.8 ns, 4.2 ns–4.8 ns, and 4.7 ns–4.8 ns.)

Since the all relative timing values are within the relative timing limits (within −2.0 ns and 0 ns), the data signal passes all test cycles. However, if the absolute timing values of the data signal are measured at 4.4 ns, 4.6 ns, and 5.1 ns, then the relative timing values are −0.4 ns, −0.2 ns and 0.3 ns (4.4 ns–4.8 ns, 4.6 ns–4.8 ns, and 5.1 ns–4.8 ns). Since one of the relative timing values (0.3 ns) is outside the relative timing limits (−2.0 ns and 0 ns), the data signal fails the test.

As with the case of the extreme absolute timing values, extreme values of the relative timing values are also selected and stored by result accumulators 160. Based on the example immediately above, result accumulators 160 will store −0.4 ns as the minimum relative timing value and 0.3 ns as maximum relative timing value. In general, the result accumulators will store extreme relative timing values including their pass/fail result.

In addition to the pass/fail timing values, result accumulators also store other useful timing values or results. For example, result accumulators 160 also store which test vector give a pass/result. Result accumulators 160 can also store information of which extreme values belong to which test vector. Moreover, timing value such as average timing values can also be calculated and stored. The average timing values include absolute and relative average timing values. Absolute average timing value is the total timing values of an output data of an output pin in all test cycles divided by the number of measurements of that output pin in all test cycles. Relative average timing value is the total timing value of all relative timing values in all test cycles divided by the number of measurements of the relative timing values. With sufficient result accumulators, the statistical distribution of measured timing values can be determined. In general, result accumulators selectively store timing values and results according to test requirements set by acquire timesets 140.

Capture/analysis engine 170 collects the stored timing value from result accumulators 160 to perform analysis of the pass/fail result based on the timing values and other results. Thus, not only a pass/fail result is captured, but analysis of the pass/fail result can also be achieved. For example, capture/analysis engine 170 can read or download both the pass/fail result and the stored extreme absolute timing values of the clock signal to check the performance characteristics of the clock signal such as clock timing variation or jitter. Capture/analysis engine 170 can also read or download the stored extreme relative timing values to determine the data signal behavior in relation to the clock signal. In addition, because the pass/fail result and other timing values results are directly measured, only a single-pass test pattern is executed. Single-pass means that the test is executed with a test pattern only once, without iteration. This is more efficient and less time consuming than the traditional test method, which usually requires many iterations. The analysis provided by capture/analysis engine 170 can be used to study the performance of the device being tested. The analysis can also be used to compare the performances between one or more devices of the same or similar type.

Figure 4:
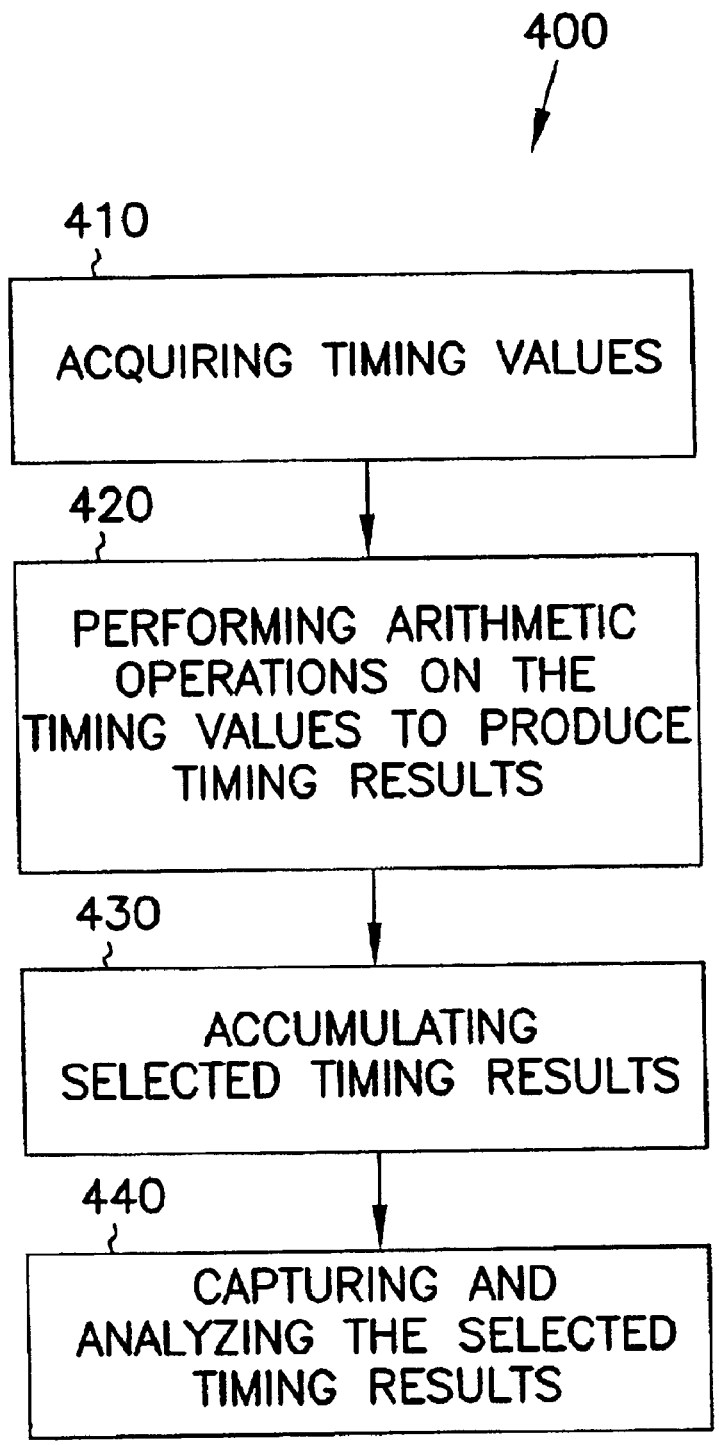
FIG. 4 is a flow chart illustrating a method of testing a VLSI device with the tester of FIG. 1 according to the invention.

FIG. 4 is a flow chart illustrating a method 400 of testing a VLSI device according to the invention. Method 400 provides not only a pass/fail results but also additional timing performance values or results. With method 400, only a single-pass test pattern is executed. Therefore, this method consumes a shorter time than the traditional test method but provides more test performance data.

In step 410, timing values of a DUT are acquired by measuring transitions of output data of each output pin of the DUT. A tester provides a reference time to measure the timing values. The timing values include at least one reference timing values and a plurality of data timing values. In a source-referenced clock-timing device, the validity of data signals is referenced to a timing of clock signal generated by the device. Thus, data timing values are measurements of transition timing of output data signal of output pins of the DUT. The reference timing value is the measurement of transition timing of the clock signal. These measured transition timing values are absolute timing values.

In step 420, arithmetic operations are performed on the timing values by a result operations unit. In one arithmetic operation, the reference absolute timing value is compared with absolute timing limits. The absolute timing limits include minimum and maximum absolute timing limits, which are predetermined by the tester. If the reference absolute timing value is within the absolute timing limits, a pass result is provided; otherwise, a fail result is provided. The pass/fail result at this point is only applied to one clock signal of one output pin in one test cycle. Thus, for the DUT to pass the test, the clock signal must be within the absolute timing limits and all output data must satisfy other timing limits. During the test, minimum and maximum values of the reference absolute timing values are generated by comparing the reference absolute timing values with each other in all test cycles. The minimum reference absolute timing value is the smallest reference absolute timing value. The maximum reference absolute timing value is the biggest reference absolute timing value.

In another arithmetic operation, the differences between the reference absolute timing value and each of the data absolute timing values are calculated to obtain relative timing values. The relative timing values are compared with relative timing limits. The relative timing limits include minimum and maximum relative timing limits, which are predetermined by the tester. If all relative timing values are within the relative limits in all test cycles and if the reference timing limit is within the absolute limits in all test cycles, then result operations unit provides a pass result, otherwise, it provides a fail result. During the test, minimum and maximum values of the relative timing values are generated by comparing the relative timing values with each other in all test cycles. The minimum relative timing value is the smallest relative timing value. The maximum relative timing value is the biggest relative timing value.

In step 430, the pass/fail result and certain timing values are stored by a plurality of result accumulators. The stored results are useful to analyze the performance of the DUT in a subsequent analysis.

In step 440, the pass/fail result, the timing values and other results stored in result accumulators are captured and analyzed by a capture/analysis engine. Capture/analysis engine can evaluate the pass/fail result and other stored result to provide overall test performance of the device.

Figure 5:
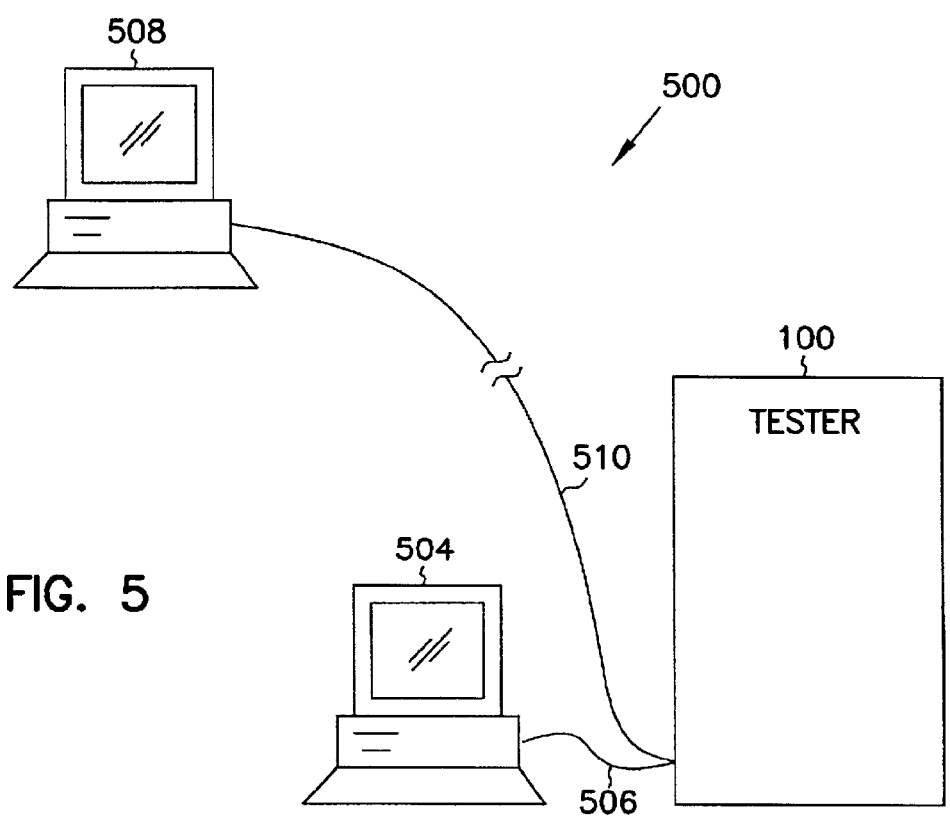
FIG. 5 is a block diagram illustrating a test system which includes the tester of FIG. 1 according to the invention.

FIG. 5 is block diagram illustrating a test system 500 according to the invention. Test system 500 includes tester 100 connected to a local computer 504 by a communication connection 506. Tester 100 also connects to a remote computer 508 by a communication connection 510. Tester 100 is the tester of the invention as described in FIG. 1. In general, tester 100 measures timing values of output pins of a DUT. Tester 100 then performs arithmetic operations, such as addition, subtraction, division and multiplication, on the measured timing values to produce a pass/fail result and additional test results. Tester 100 stores the pass/fail result and a selected number of the additional test results. Subsequently, tester 100 analyzes the performance of the DUT based on both the stored pass/fail and the selected test results. The test results can also be analyzed by local computer 504, which downloads test results stored in tester 100. Furthermore, the test results can also be downloaded and analyzed by remote computer 508 located at a remote site.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of testing a digital device, the method comprising:
   measuring timing values of output data of the digital device to produce measured timing values;
   comparing the measured timing values with each other to produce relative timing values;
   comparing the measured timing values with a first set of timing limits;
   comparing the relative timing values with a second set of timing limits;
   selecting a number of measured timing values;
   selecting a number of relative timing values;
   storing the selected measured timing values and the selected relative timing values; and
   analyzing the selected measured timing values and the selected relative timing values.

2. The method of claim 1, wherein measuring includes measuring transition timing of output signal of each output pin of the digital device in each test cycle.

3. The method of claim 1, wherein measuring includes measuring transition timing of clock signals and data signals.

4. The method of claim 1, wherein comparing the measured timing values with each other includes comparing measured timing value of a clock signal with measured timing value of a data signal.

5. The method of claim 1, wherein comparing the measured timing values with a first set of timing limits includes comparing the measured timing values with a minimum and a maximum absolute timing limit.

6. The method of claim 1, wherein comparing the relative timing values with a second set of timing limits includes comparing the relative timing values with a minimum and a maximum relative timing limit.

7. The method of claim 1, wherein selecting a number of measured timing values includes selecting a smallest measured timing value and a biggest measured timing value.

8. The method of claim 1, wherein selecting a number of relative timing values includes selecting a smallest relative timing value and a biggest relative timing value.

9. The method of claim 1, wherein the number of the selected measured timing values and the number of the selected relative timing values are substantially smaller than a number of the measured timing values.

10. The method of claim 1 further comprising traditional comparing of the output data with expected data before measuring timing values of the output data.

11. The method of claim 1 further comprising:
calculating an average of the measured timing values;
calculating an average of the relative timing values;
storing the average of the measured timing values; and
storing the average of the relative timing values.

12. The method of claim 1, wherein only a single-pass test pattern is used during a test.

13. A method of testing a digital device, the method comprising:
measuring transition timing values of output data of output pins of the device to obtain a number of measured timing values, the number of measured timing values including at least one reference timing value and a plurality of data timing values;
comparing the reference timing value with absolute timing limits to produce pass/fail information;
calculating a difference between the reference timing value and the data timing values to produce relative timing values;
comparing the relative timing values with relative timing limits to produce additional pass/fail information;
providing a pass/fail result;
storing a number of selected reference timing values and a number of selected relative timing values; and
capturing the pass/fail result and the selected reference timing value and the selected relative timing values.

14. The method of claim 13, wherein measuring transition timing values includes measuring a transition timing of output signal of each of the output pins of the device in each test cycle.

15. The method of claim 13, wherein comparing the reference timing values includes comparing the reference timing values with a minimum and a maximum absolute timing limit.

16. The method of claim 13, wherein comparing the relative timing values includes comparing the relative timing values with a minimum and a maximum relative timing limit.

17. The method of claim 13, wherein the number of selected reference timing values and the number of selected relative timing values are substantially smaller than the number of measured timing values.

18. The method of claim 13, wherein the selected reference values include smallest and biggest reference values, and the selected relative timing values include smallest and biggest relative timing values.

19. The method of claim 13 further includes comparing the output data with expected data before measuring transition timing values of the output data.

20. The method of claim 13 further comprising:
calculating an average of the reference timing values;
calculating an average of the relative timing values;
storing the average of the reference timing values; and
storing the average of the relative timing values.

21. A method of testing a digital device, the method comprising:
acquiring measured timing values of output pins of the device by measuring a transition of an output signal of each of the output pins of the digital device in each test cycle;
performing arithmetic operations on the measured timing values to accumulate a pass/fail result and selected timing values, wherein performing the arithmetic operations includes comparing each of the measured timing values with at least one timing limit to produce the pass/fail result, comparing at least two of the measuring timing values with each other to produce a number of relative timing values, and selecting a set of relative timing values among the number of relative timing values to provide the selected timing values; and
reading the pass/fail result and the selected timing values.

22. A method of testing a digital device, the method comprising:
acquiring measured timing values of output pins of the device by measuring a transition of an output signal of each of the output pins of the digital devise in each test cycle;
performing arithmetic operations on the measured timing values to accumulate a pass/fail result and selected timing values; and
reading the pass/fail result and the selected timing values, wherein performing arithmetic operations includes:
comparing the measured transition timing values with absolute timing limits;
calculating differences between the measured timing values to produce relative timing values; and
comparing the relative timing values with relative timing limits.

23. A method of testing a digital device, the method comprising:
acquiring measured timing values of output pins of the device by measuring a transition of an output signal of each of the output pins of the digital device in each test cycle;
performing arithmetic operations on the measured timing values to accumulate a pass/fail result and selected timing values;
reading the pass/fail result and the selected timing values; and
selecting a set of selected measured timing values and a set of selected relative timing values to produce the selected timing values.

24. The method of claim 23, wherein the set of selected measured timing values includes smallest and biggest measured timing values, and the set selected relative timing values includes smallest and biggest relative timing values.

25. The method of claim 24 further including:
calculating an average of the measured timing values; and
calculating an average of the relative timing values.

26. A tester comprising:
a plurality of time measurement unit to measure transition timing values of output data of output pins of a device being tested;
a plurality of result operations units connected to the time measurement unit to perform real-time arithmetic operations on the transition timing values to provide pass/fail information and timing values information, wherein the plurality of result operations units are configured to compare the transition timing values with at least one timing limit to produce the pass/fail result, to compare at least two of the transition timing values with each other to produce a number of relative timing values, and to select a set of relative timing values among the number of relative timing values to provide the timing values information;
a plurality of result accumulators connected to the result operations units to store the pass/fail information and selected timing values information; and a capture/analysis engine connected to the result operations units and the result accumulators to capture and analyze the pass/fail result and the timing values information.

27. The tester of claim 26 further comprising:

a compare circuit connected between each of the time measurement units and the device being tested;

a plurality of acquire timesets to provide instructions to the time measurement units and result operations units; and a test pattern memory to provide expected test data to the compare circuit, and to provide instructions to the acquire timesets.

28. The tester of claim 27, wherein the time measurement units are configured to measure a transition timing value of output data of each of the output pins of the device being tested.

29. A test system comprising:

a tester;

a local computer connected to the tester; and a remote computer connected to the tester, wherein the remote computer and the local computer are configured to download stored pass/fail result and timing value results from the tester, wherein the pass/fail result and timing value results are calculated by performing real-time arithmetic operations on transitions of output data of output pins of a device being tested by the tester, wherein the tester is configured to compare transition timing values of the transitions with at least one timing limit to produce the pass/fail result, to compare at least two of the transition timing values with each other to produce a number of relative timing values, and to select a set of relative timing values among the number of relative timing values to provide the timing value results.

30. The system of claim 29, wherein the tester comprising:

a plurality of time measurement units to measure the transition timing values of output data of output pins of a device being tested;

a plurality of result operations units connected to the time measurement unit to perform the real-time arithmetic operations on the transition timing values to provide the stored pass/fail information and timing value results;

a plurality of result accumulators connected to the result operations units to store the stored pass/fail information and timing value results; and a capture/analysis engine connected to the result operations units and the result accumulators to capture and analyze the stored pass/fail result and the timing value results.

31. The system of claim 30, wherein the tester further comprising:

a compare circuit connected between each of the time measurement units and the device being tested;

a plurality of acquire timesets to provide instructions to the time measurement units and result operations units; and a test pattern memory to provide expected test data to the compare circuit, and to provide instructions to the acquire timesets.

* * * * *